United States Patent
Kalnitsky et al.

(10) Patent No.: US 8,633,086 B2
(45) Date of Patent: Jan. 21, 2014

(54) POWER DEVICES HAVING REDUCED ON-RESISTANCE AND METHODS OF THEIR MANUFACTURE

(75) Inventors: Alex Kalnitsky, San Francisco, CA (US); Hsiao-Chin Tuan, juDong County (TW); Liang-Kai Han, Taipei (TW); Uway Tseng, Tai-zhong (TW); Yuan-Chih Hsieh, Hsinchu (TW); Hung-Hua Lin, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 819 days.

(21) Appl. No.: 12/651,322

(22) Filed: Dec. 31, 2009

(65) Prior Publication Data

US 2011/0156217 A1   Jun. 30, 2011

(51) Int. Cl.
   *H01L 21/30* (2006.01)
(52) U.S. Cl.
   USPC ........... 438/455; 438/458; 438/459; 438/460; 438/462; 438/464
(58) Field of Classification Search
   USPC .................. 438/455, 458, 459, 460, 462, 464
   See application file for complete search history.

(56) References Cited

U.S. PATENT DOCUMENTS

| 7,148,125 B2 * | 12/2006 | Suzuki et al. | 438/459 |
| 2008/0070379 A1 * | 3/2008 | Kikuchi | 438/460 |
| 2009/0079038 A1 * | 3/2009 | Schneegans et al. | 257/620 |

OTHER PUBLICATIONS http://www.disco.co.jp/eg/news/product/20051128.html, News Releases, Products Information, Development of TAIKO Process, A New Process Method for Wafer Backgrinding, Nov. 28, 2005.

* cited by examiner

*Primary Examiner* — David Vu
*Assistant Examiner* — Brandon Fox
(74) *Attorney, Agent, or Firm* — Lowe Hauptman & Ham, LLP

(57) ABSTRACT

A method for forming a support structure for supporting and handling a semiconductor wafer containing vertical FETs formed at the front surface thereof is provided. In one embodiment, a semiconductor wafer is provided having a front surface and a rear surface, wherein the front surface comprises one or more dies separated by dicing lines. The wafer is thinned to a predetermined thickness. A plurality of patterned metal features are formed on a thinned rear surface to provide support for the wafer, wherein each of the plurality of patterned metal features covers substantially one die, leaving the dicing lines substantially uncovered. The wafer is thereafter diced along the dicing lines to separate the one or more dies for later chip packaging.

24 Claims, 7 Drawing Sheets

POWER DEVICES HAVING REDUCED ON-RESISTANCE AND METHODS OF THEIR MANUFACTURE

TECHNICAL FIELD

The present disclosure relates generally to semiconductor device manufacturing, and more particularly, to semiconductor power devices having reduced on-resistance and methods of their manufacture.

BACKGROUND

Substrate series resistance represents a significant portion of the overall device on-resistance in vertical power devices. Current manufacturing methods accomplish the reduction in substrate series resistance by grinding material off the backside of the wafers after the necessary circuit patterns have been fabricated on the front side of the wafers. The final wafer thickness, however, is limited since continued grinding of material off the backside of the wafer increases the risk that the wafer may crack or break due to the stress created during the thickness-trimming (thinning) process. Moreover, too much material ground off the backside of the wafer increases the risk that the wafer may crack or break during wafer handling. FIG. 1 shows a simplified cross-sectional view of a partial semiconductor wafer 110 having the gate and source electrodes of a vertical power Field Effect Transistor (FET) formed near the front surface 120 of wafer 110 and the drain formed at the rear surface 130 thereof. Where X represents the thickness of the FET device region having source and gate electrodes, and Y represents the thickness of the drain electrode region. If too much thickness Y of rear surface 130 or the bulk silicon is removed, wafer handling becomes nearly impossible.

Even if the wafer survives the wafer thickness-trimming process, the thinned wafer may still be subject to breakage during the die sawing process. During the sawing process, stress may be created in the dicing lane regions. The created stress is a source of crack propagation into integrated circuit regions causing fatal defects.

For these reasons and other reasons that will become apparent upon reading the following detailed description, there is a need for an improved method for supporting and handling ultra thin semiconductor wafers that reduces the risk of wafer damage.

SUMMARY

The present disclosure is directed to a method for forming a support structure for supporting and handling a semiconductor wafer containing vertical FETs formed at the front surface of the wafer. In one embodiment, a semiconductor wafer is provided having a front surface and a rear surface, wherein the front surface comprises one or more dies separated by dicing lines. The wafer is trimmed (thinned) from a rear surface to a predetermined thickness. A plurality of patterned metal features are formed on the thinned rear surface to provide support for the wafer, wherein each of the plurality of patterned metal features covers substantially one die, leaving the dicing lines substantially uncovered. The wafer is thereafter diced along the dicing lines to separate the one or more dies for later chip packaging.

Another aspect of the present disclosure is to provide a method for forming a plurality of patterned metal features on a backside of a wafer containing field-effect (FET) device regions. In one embodiment, a semiconductor wafer is provided having a front surface and a rear surface, wherein the front surface comprises one or more FET device regions separated by dicing lines. The wafer is thinned from a rear surface to a predetermined thickness. A plurality of patterned metal features are formed on the thinned rear surface to provide support for the wafer, wherein each of the plurality of patterned metal features covers substantially one FET device region, leaving the dicing lines substantially uncovered. Thereafter, the wafer is diced along the dicing lines to separate the wafer into individual dice, each containing a FET device region.

In accordance with another aspect of the present invention, a wafer having a front surface and a thinned rear surface is provided. In one embodiment, one or more dies are formed on the front surface, wherein the dies are separated by dicing lines. A plurality of protection elements are formed on the thinned rear surface, wherein each of the plurality of protection elements covers substantially one die for protecting the dies from undesirable cracking while the wafer is being diced along respective dicing lines.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having ordinary skill in the art will recognize that embodiments can be practiced without these specific details. In some instances, well-known structures and processes have not been described in detail to avoid unnecessarily obscuring descriptions.

Reference throughout this specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout this specification are not necessarily all referring to the same embodiment.

Furthermore, the particular features, structures, or characteristics may be combined in any suitable manner in one or more embodiments. It should be appreciated that the following figures are not drawn to scale; rather, these figures are merely intended for illustration.

Figure 1:
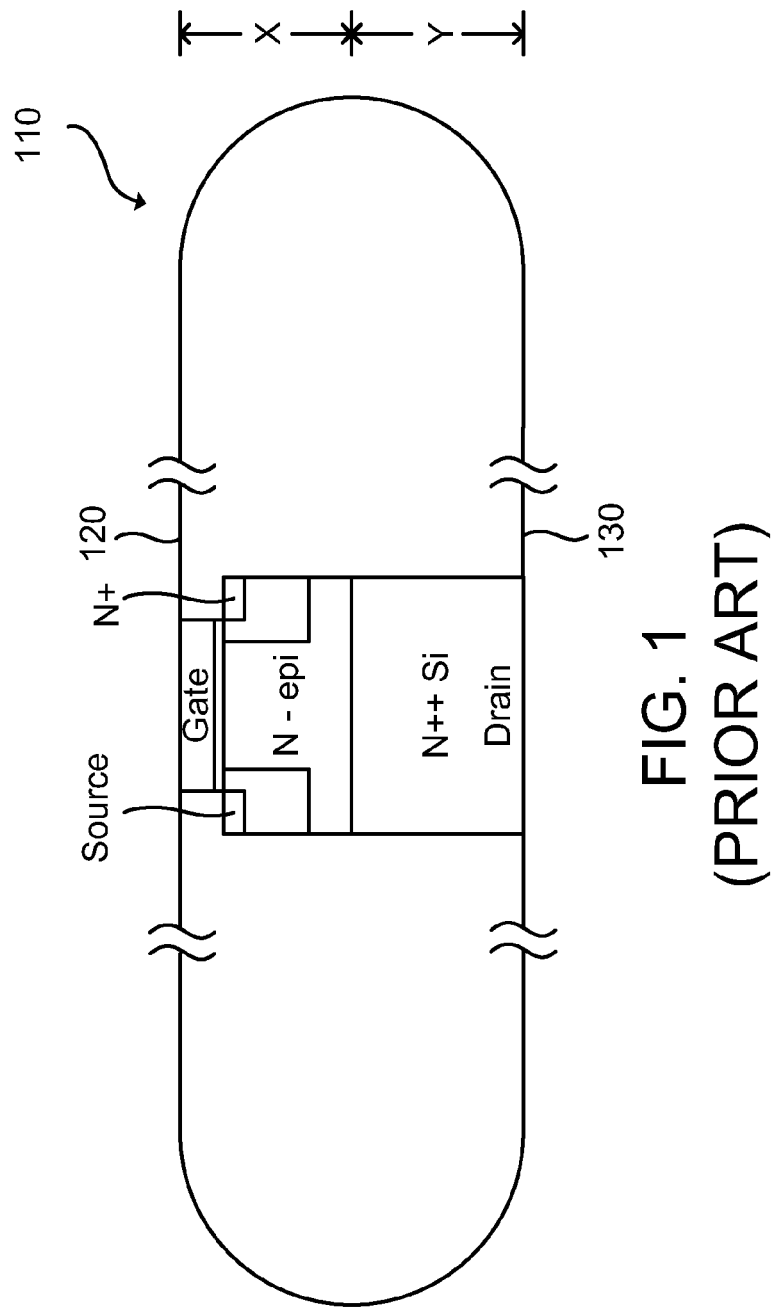
FIG. 1 is a cross-sectional view of a semiconductor wafer containing a FET device formed therein.
Figure 2A:
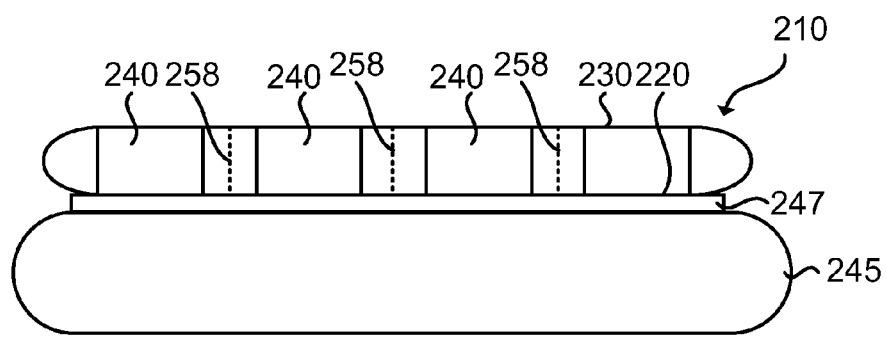
FIGS. 2A-2D are cross-sectional views of a semiconductor wafer at various stages of forming a support structure, according to embodiments of the present disclosure.

FIGS. 2A-2D are cross-sectional views of a semiconductor wafer at various stages of forming a support structure for supporting and handling the wafer, according to embodiments of the present invention. FIG. 2A shows a semiconductor wafer 210 having a plurality of integrated circuit chips (dies) 240 separated by dicing lines 258. In one embodiment, in the manufacturing of power devices, wafer 210 is a heavily doped N++(or P++) wafer with a layer of lightly doped epitaxial (N or P) silicon formed on the heavily doped substrate. Wafer 210 has a front surface 220 referred to as an active surface and a rear surface 230 opposite the front surface 220. Integrated circuits (not shown) including active and passive devices such as transistors, CMOS, NMOS, resistors, capacitors, diodes fuses, dielectric layers, metal layers, and the like, are formed at the front surface 220 of wafer 210. In one exemplary embodiment, the integrated circuit comprises a field-effect transistor (FET) where the gate and source electrodes are formed near the front surface 220, and the drain electrode formed in a bulk silicon or at the rear surface 230 of the wafer 210.

Further, in FIG. 2A, a wafer carrier 245 is attached to the front surface 220 of wafer 210 by an adhesive layer 247, according to one embodiment. Wafer carrier 245 acts as a temporary support substrate or carrier to facilitate wafer handling, transport, and processing. In some embodiments, wafer carrier 245 is a silicon substrate, glass substrate, polymer substrate, polymer-based composite substrate, or thick tape and is attached to the front surface 220 of the wafer 210 by, for example, adhesive bonding, tape bonding, or resin bonding. Wafer carrier 245 is preferably rigid because a rigid carrier helps to reduce wafer warping and prevents wafer breakage during handling, transport, and processing.

Having attached the wafer 210 to the wafer carrier 245, the wafer 210 is now ready for a thickness-trimming process, e.g. backside grinding, where a portion of wafer 210 on the rear surface 230 is to be removed. The non-chip side or the rear surface 230 of wafer 210 is mechanically ground by a grinder, a chemical mechanical polish (CMP), or some other suitable removal process to reduce the thickness thereof. With mechanical grinding, wafer 210 is ground to a predetermined thickness, depending on particular applications. However, further reduction in the thickness of wafer 210 by mechanical grinding may result in damage to the wafer. Therefore, to further reduce the thickness of wafer 210, it is preferable to use a method less likely to cause damage during this process such as, for example, wet chemical etching, dry chemical etching, polishing, or plasma etching.

Figure 2B:
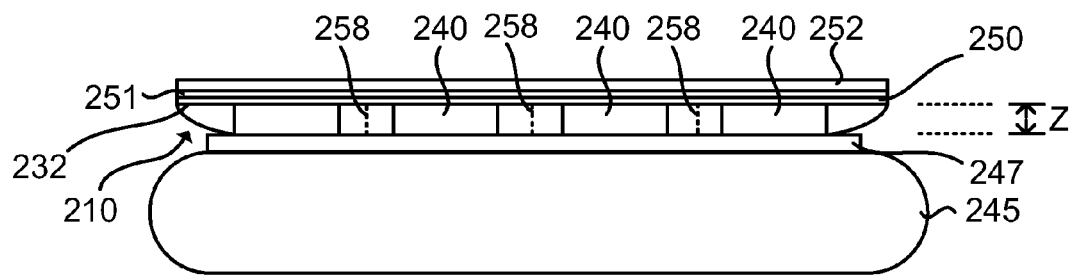

The thickness-trimming process is performed on the wafer 210 to a predetermined thickness Z, as shown in FIG. 2B. An aspect of the present disclosure allows the thickness of a wafer to be trimmed to a reduced thickness that may otherwise cause wafer damage during handling, transport, processing, or wafer dicing. This is because an aspect of the disclosure provides a support structure to be formed over the backside of the wafer. This support structure, which will be described in more detail below, helps the wafer resist warpage, vibrations, or other such stresses that would otherwise cause cracks to propagate in the wafer leading to wafer damage. The predetermined thickness Z of wafer 210 can be set depending on the purpose for which the die is to be used. In one embodiment, the wafer 210 is trimmed to a thickness of from about 2 μm to about 25 μm, depending on the process used and tolerances applied.

The support structure for providing such support to wafer 210 comprises a plurality of patterned metal features formed on the trimmed rear surface 232 of wafer 210. Each of the plurality of patterned metal features covers substantially one die region but leaves the dicing lines substantially uncovered. The patterned metal features are formed by first depositing a glue layer 250 on the thinned rear surface 232 of the wafer 210. The glue layer 250 provides adhesion of a plurality of later-to-be-formed metal layers to the wafer surface. According to one embodiment of the present invention, the glue layer 250 comprises titanium, titanium-nitride, titanium tungsten, or tantalum tungsten (TaW) and is deposited on the wafer 210 by a conventional sputtering process, although other suitable processes may alternatively be used. In one embodiment, the glue layer 250 has a thickness of from about 500 Angstroms to about 4,000 Angstroms, depending on process, feature requirements, and other parameters. In some embodiments, the glue layer 250 has a thickness of from about 1,000 Angstroms to about 2,000 Angstroms.

A seed layer 251 comprising copper is further formed on top of the glue layer 250. In some embodiments, the seed layer 251 is formed on top of the glue layer 250 by sputtering, for example. In one embodiment, seed layer 251 has a thickness of from about 500 Angstroms to about 6,000 Angstroms. Still referring to FIG. 2B, a photoresist layer 252 is thereafter deposited over the seed layer 251. Employing conventional lithography techniques such as masking, exposure, and developing, a patterned photoresist layer 252 is formed on the seed layer 251. After patterned photoresist layer 252 is partially removed, the patterned photoresist layer 252 covers substantially the dicing lines 258 but leaves substantially the dice region 240 uncovered so that the dicing lines 258 remained unobstructed for the cutting blade during a subsequent wafer sawing process.

Figure 2C:
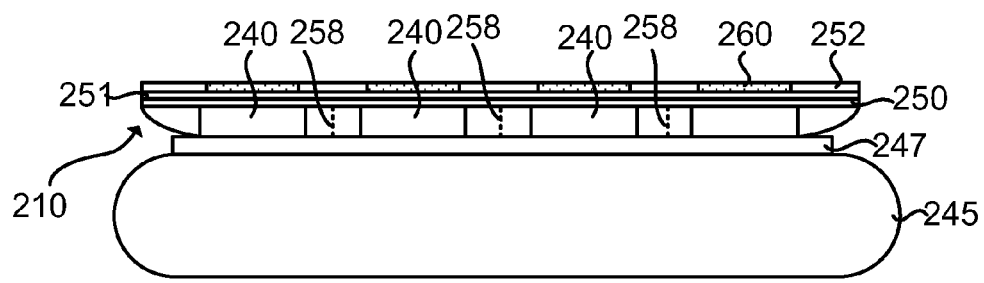
Figure 2D:
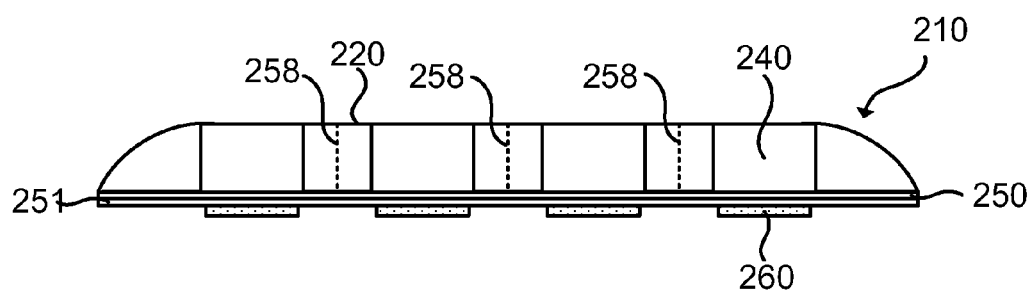
Figure 3:
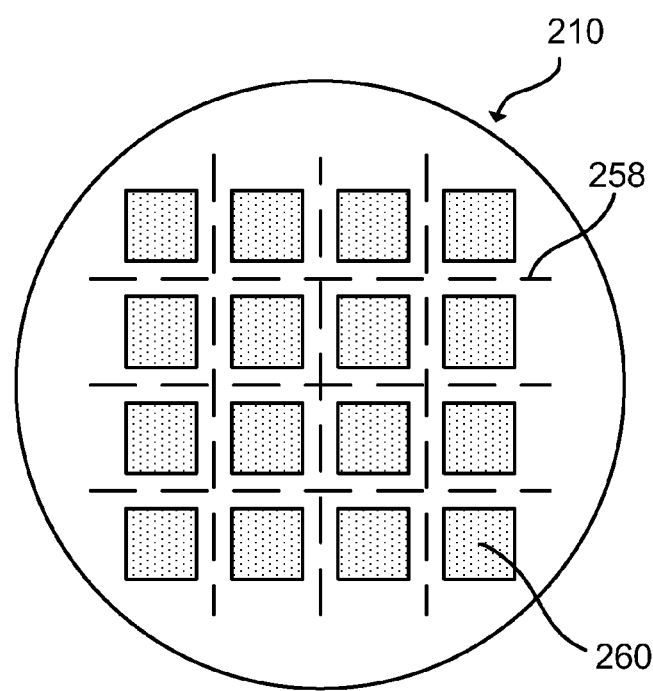
FIG. 3 is a top view of a semiconductor wafer having protection elements formed thereon, according to one embodiment of the present disclosure.

As shown in FIG. 2C, the portions of the photoresist layer 252 covering the dice regions 240 above the seed layer 251 are removed, and in an electroplating process for example, the removed portions are then filled in with a protection element, a metal layer, or a metal feature 260. The metal feature 260 is electroplated to a thickness of from about 1 μm to about 25 μm and may comprise Cu/Ni/Au, Cu/Ni/Pd, Cu/Ni/Ag, or Cu/Ni/solder. The photoresist layer 252 is thereafter removed by an appropriate removal process to define the patterned metal feature 260. Patterned metal features 260 are added on wafer 210 to reduce cracking and help absorb stress imposed on the wafer and are arranged to protect the individual die from being cracked unintentionally. The metal feature 260 may comprise any shape. In some embodiments, the metal feature 260 has a particular shape that will provide the best protection effect during a later dicing process. Some of these protection elements further enhance the local material strength so that the unintended cracks will not propagate toward the dies 240. In one embodiment, the metal feature 260 has a polygonal shape such as square, rectangle, or circular or elliptical shape. In another embodiment, the metal feature 260 comprises the drain electrode of a FET device in wafer 210. The drain electrode has a square shape or rectangular shape, according to one embodiment. FIG. 2D is a cross-sectional view of semiconductor wafer 210 having the patterned metal feature 260 formed thereon. Further, FIG. 3 is a top view of the semiconductor wafer 210 having the patterned metal feature 260 formed thereon.

Figure 4A:
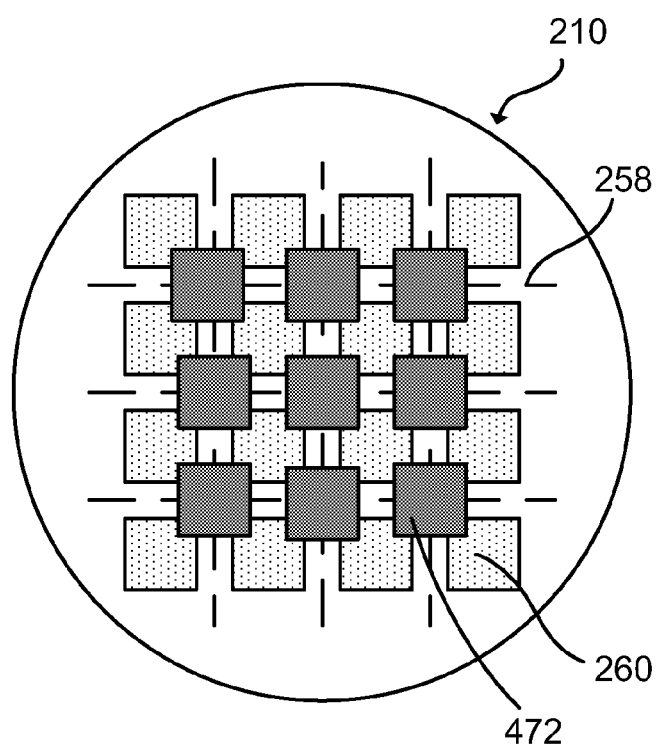
FIG. 4A is a top view of a semiconductor wafer having support elements formed above and in communication with the protection elements, according to one embodiment of the present disclosure.
Figure 4B:
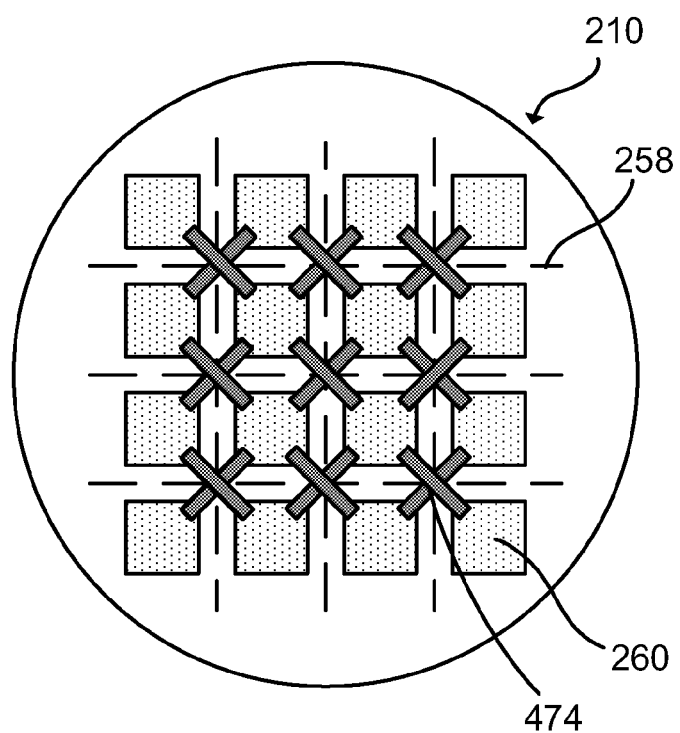
FIG. 4B is a top view of a semiconductor wafer with support elements formed above and in communication with the protection elements, according to another embodiment of the present disclosure.

FIG. 4A is a top view of wafer 210 having square support layers 472 formed above and in communication with the patterned metal features 260, according to one embodiment. One or more support elements 472 are formed on the patterned metal features 260 to provide additional support for the wafer 210. Each support element 472 is coupled to two or more patterned metal features 260. At least in one embodiment, support elements 472 are formed during the formation of photoresist layer 252 and are defined in the photoresist layer. In some embodiments, support elements 472 are formed with the same materials and at the same time as patterned metal features 260. The support element 472 may be formed in any shape. In one embodiment, a support element 472 has a square, rectangle, circle shape, or cross shape. In some embodiments, the specific shape of each support element 472 is not an important feature. Further, in at least one embodiment, it is desirable to minimize the amount of the support materials (e.g., copper) in the scribe lines to prevent dicing issues. Those of ordinary skill in the art will recognize that other shapes are possible, which will also provide the necessary support for the patterned metal features 260. FIG. 4B is a top view of wafer 210 with cross-shaped support elements 474 formed above and in communication with the patterned metal features 260, according to another embodiment.

Figure 5:
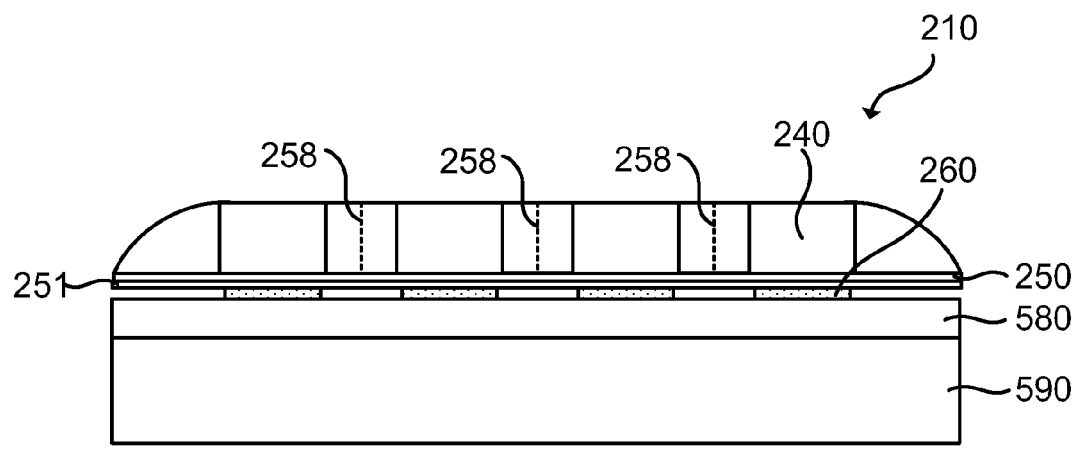
FIG. 5 is a cross-sectional view of a semiconductor wafer having a support structure formed thereon, the wafer placed on a dicing tape prior to a sawing process, according to one embodiment of the present disclosure.
Figure 6:
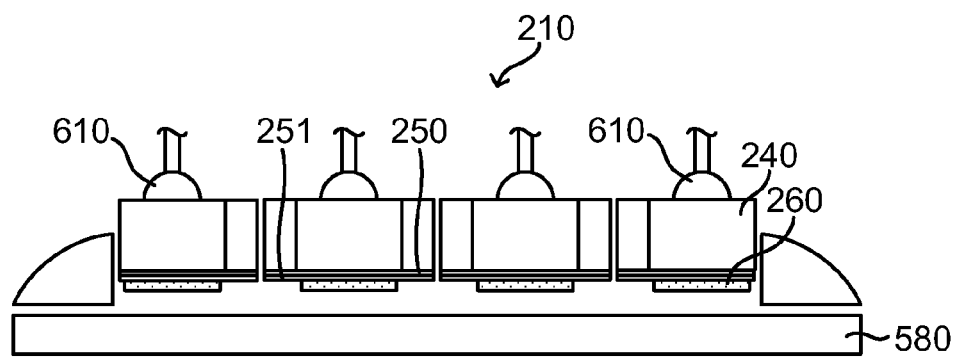
FIG. 6 is a cross-sectional view of the semiconductor wafer of FIG. 5 after having undergone a sawing process, according to one embodiment of the present disclosure.

Referring to FIG. 5, the wafer 210 is then affixed to a dicing tape 580 on a cutting chuck 590. The dicing tape 580 is used to hold the wafer 210 in place on the cutting chuck 290 during the dicing process. As shown in FIG. 6, the wafer 210 is then diced by a cutting blade (not shown) in the usual manner along dicing lines 258 to separate it into individual chips that are then picked up, usually one at a time, by a pick-up-tool 610 for placement in individual chip packages. Since stress may be created at the dicing lines 258 during sawing of the semiconductor wafer 210, with the support structure provided to the die by the metal features 260 and/or support elements 472 or 474, the stress created at the dicing lines 258 is reduced. Thus, inadvertent breakage of the dice from cracks propagating in the wafer is effectively eliminated. It is to be understood by those of ordinary skill in the art that other dicing parameters are also factors to be considered in order to control wafer cracking. These parameters may include cut speed, fitting speed and fluid flow rate. For example, a fast cut speed could reduce the crack formation during wafer dicing because faster wafer cut speed could reduce the likelihood of having crack nucleation, growth, or propagation.

Exemplary embodiments of the proceeding disclosure for forming a support structure for supporting and handling an ultra thin wafer have been described that reduces the risk of wafer damage during wafer handling, transport, processing, and dicing. Furthermore, where the bulk silicon layer in an ultra thin wafer containing a FET device has been thinned away, the patterned metal features 260 not only acts as a support structure for the wafer but also acts as the drain electrode of the FET device.

It will be evident, however that various modifications, structures, processes, and changes may be made thereto without departing from the broader spirit and scope of the embodiments, as set forth in the claims. The specification and drawings are, accordingly, to be regarded as illustrative and not restrictive. It is understood that embodiments are capable of using various other combinations and environments and are capable of changes or modifications as expressed herein.

What is claimed is:

1. A method for forming a support structure for supporting and handling a semiconductor wafer, comprising:
    providing a semiconductor wafer having a front surface and a rear surface, wherein the front surface comprises one or more dies separated by dicing lines;
    thinning the wafer from the rear surface to a predetermined thickness;
    forming a plurality of patterned metal features on the thinned rear surface to provide support for the wafer, wherein each of the plurality of patterned metal features is formed using a photolithographic process and covers substantially one die, leaving the dicing lines substantially uncovered; and
    dicing the wafer along the dicing lines to separate the one or more dies.

2. The method of claim 1, wherein the wafer includes a vertical field-effect transistor (FET) formed at the front surface thereof.

3. The method of claim 1, wherein thinning the wafer comprises mechanical grinding, chemical mechanical polish (CMP), wet etching, dry etching, dry polishing, or plasma etching, and the wafer is thinned to a thickness of from about 2 μm to about 25 μm.

4. The method of claim 1, wherein forming the plurality of patterned metal features comprises:
    providing a wafer carrier to support the wafer;
    depositing a glue layer on the thinned rear surface of the wafer;
    depositing a seed layer on the glue layer;
    forming a patterned photoresist layer on the seed layer, the patterned photoresist layer covering substantially the dicing lines but leaving substantially the dice region uncovered;
    electroplating a metal layer over the patterned photoresist layer; and
    removing the patterned photoresist layer.

5. The method of claim 4, wherein the glue layer comprises titanium, titanium, nitride, titanium tungsten, or tantalum tungsten (TaW) and is deposited on the wafer by sputtering.

6. The method of claim 4, wherein the seed layer comprises copper.

7. The method of claim 4, wherein the metal layer comprises Cu/Ni/Au, Cu/Ni/Pd, Cu/Ni/Ag, or Cu/Ni/solder and is formed by electroplating.

8. The method of claim 1, wherein one of the plurality of patterned metal features has a shape comprising a square, rectangle, or circle and has a thickness of from about 1 μm to about 25 μm.

9. The method of claim 1, wherein the metal features comprise drain electrodes.

10. The method of claim 1, further comprising forming one or more support elements on the metal features to provide additional support for the wafer, wherein each support element coupling to two or more of the metal features.

11. The method of claim 10, wherein each support element comprises Cu/Ni/Au, Cu/Ni/Pd, Cu/Ni/Ag, or Cu/Ni/solder.

12. A method for forming a plurality of patterned metal features on the backside of a wafer containing field-effect transistor (FET) device regions, the method comprising:
    providing a semiconductor wafer having a front surface and a rear surface, wherein the front surface comprises one or more FET device regions separated by dicing lines;
    thinning the wafer from the rear surface to a predetermined thickness;
    forming a plurality of patterned metal features on the thinned rear surface to provide support for the wafer, wherein each of the plurality of patterned metal features is formed using a photolithographic process and covers substantially one FET device region, leaving the dicing lines substantially uncovered; and dicing the wafer along the dicing lines to separate the wafer into individual dice, each containing a FET device region.

13. The method of claim 12, wherein forming the plurality of patterned metal features comprises:
   providing a wafer carrier to support the wafer;
   depositing a glue layer on the thinned rear surface of the wafer;
   depositing a seed layer on the glue layer;
   forming a patterned photoresist layer on the seed layer, the patterned photoresist layer covering substantially the dicing lines but substantially leaving the dice region uncovered;
   electroplating a metal layer over the patterned photoresist layer; and
   removing the patterned photoresist layer.

14. The method of claim 13, wherein the glue layer comprises titanium, titanium, nitride, titanium tungsten, or tantalum tungsten (TaW) and is deposited on the wafer by sputtering.

15. The method of claim 13, wherein the metal layer comprises Cu/Ni/Au, Cu/Ni/Pd, Cu/Ni/Ag, or Cu/Ni/solder.

16. The method of claim 12, wherein one of the plurality of patterned metal features has a shape comprising a square, rectangle, or circle and has a thickness of from about 1 μm to about 25 μm.

17. The method of claim 12, further comprising forming one or more support elements on the metal features to provide additional support for the wafer, wherein each support element coupling to two or more of the metal features.

18. A wafer having a front surface and a thinned rear surface, the wafer comprising:
   one or more dies formed on the front surface, wherein the dies being separated by dicing lines;
   a plurality of protection elements formed on the thinned rear surface wherein each of the plurality of protection elements covers substantially one die for protecting the dies from undesirable cracking while the wafer is being diced along respective dicing lines; and
   one or more support elements formed on the protection elements to provide additional support for the wafer, each of the one or more support elements coupling to two or more of the protection elements.

19. The wafer of claim 18, further comprising a glue layer and a seed layer formed between the thinned rear surface and the plurality of protection elements.

20. The wafer of claim 19, wherein the glue layer comprises titanium, titanium, nitride, titanium tungsten, or tantalum tungsten (TaW) and is deposited on the wafer by sputtering.

21. The wafer of claim 18, wherein the protection elements comprises Cu/Ni/Au, Cu/Ni/Pd, Cu/Ni/Ag, or Cu/Ni/solder.

22. The wafer of claim 18, wherein each of the plurality of protection elements has a shape comprising a square, rectangle, or circle and has a thickness of from about 1 μm to about 2 μm.

23. The wafer of claim 18, wherein the protection elements comprise drain electrodes.

24. The wafer of claim 18, wherein the protection elements comprise conductive elements.

* * * * *